(12) United States Patent
Song (10) Patent No.: US 11,740,515 B2
(45) Date of Patent: Aug. 29, 2023

(54) DISPLAY DEVICE AND METHOD OF MANUFACTURING THE SAME

(71) Applicant: Samsung Display Co., LTD., Yongin-si (KR)

(72) Inventor: Juhee Song, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 446 days.

(21) Appl. No.: 16/935,821

(22) Filed: Jul. 22, 2020

(65) Prior Publication Data

US 2021/0068281 A1 Mar. 4, 2021

(30) Foreign Application Priority Data

Sep. 4, 2019 (KR) .................. 10-2019-0109345

(51) Int. Cl.
*G02F 1/1333* (2006.01)
*G02F 1/1339* (2006.01)
*H10K 77/10* (2023.01)
*G09F 9/30* (2006.01)
*H10K 102/00* (2023.01)

(52) U.S. Cl.
CPC ........ *G02F 1/13394* (2013.01); *H10K 77/111* (2023.02); *G02F 1/133305* (2013.01); *G02F 2201/503* (2013.01); *G09F 9/301* (2013.01); *H10K 2102/311* (2023.02)

(58) Field of Classification Search
CPC ........... G02F 1/13394; G02F 1/133311; G02F 1/133305; G02F 2201/07; G02F 2201/50; G02F 2201/503; G09F 9/301; H01L 51/0097; H01L 2251/5338
See application file for complete search history.

(56) References Cited

U.S. PATENT DOCUMENTS

| 2015/0036093 A1* | 2/2015 | Matsuura .............. G02F 1/1339 445/25 |
| 2018/0136371 A1* | 5/2018 | Kim ........................ B32B 27/06 |
| 2018/0151835 A1* | 5/2018 | Kim .................... H01L 51/5253 |

FOREIGN PATENT DOCUMENTS

| KR | 10-2007-0010573 | 1/2007 |
| KR | 10-1236646 | 2/2013 |
| KR | 10-1356547 | 1/2014 |
| KR | 10-2014-0013355 | 2/2014 |
| KR | 10-2016-0111580 | 9/2016 |
| KR | 10-2017-0120731 | 11/2017 |
| KR | 10-2018-0034758 | 4/2018 |

* cited by examiner

*Primary Examiner* — Angela K Davison
(74) *Attorney, Agent, or Firm* — KILE PARK REED & HOUTTEMAN PLLC (57) ABSTRACT

A display device includes a display panel and a shock absorbing structure including protrusions and an elastic member. The display panel has a folding area. The protrusions are disposed on the display panel and they may be arranged in a pattern. The elastic member is disposed on the protrusions such that a part of an upper portion of each of the protrusions is impregnated within the elastic member. Methods of manufacturing the display device are also provided.

19 Claims, 10 Drawing Sheets

DISPLAY DEVICE AND METHOD OF MANUFACTURING THE SAME

CROSS-REFERENCE TO RELATED APPLICATION(S)

This application claims priority to and benefit of Korean Patent Application No. 10-2019-0109345, filed on Sep. 4, 2019 in the Korean Intellectual Property Office, the disclosure of which is incorporated herein by reference in its entirety.

BACKGROUND

1. Technical Field

Embodiments of the disclosure relate generally to a display device and a method of manufacturing the same. Embodiments also relate to a flexible display device and a method of manufacturing the same.

2. Description of the Related Art

Flat panel display devices are used as display devices for replacing a cathode ray tube display device due to light-weight and thin characteristics thereof. As representative examples of such flat panel display devices, there are a liquid crystal display device and an organic light emitting diode display device.

A flexible display device has been developed, in which a lower substrate and an upper substrate of a display panel included the display device may include a flexible material, and a portion of the display panel may be bent and folded. For example, the lower substrate included in the display panel may be formed of a polyimide substrate, and the upper substrate included in the display panel may have a thin film encapsulation structure. The flexible display device may display an image even in a portion where the display panel is folded. In other words, the flexible display device may include a display area in which an image is displayed, and a portion of the display area may be folded. In the flexible display device, a protective film may be disposed on the display panel to protect the display panel. However, when a thickness of the protective film is increased in order to ensure impact resistance characteristics, the protective film may be delaminated from the display panel.

SUMMARY

Embodiments provide a flexible display device.

Embodiments provide a method of manufacturing a flexible display device.

According to embodiments, a display device may include a display panel and a shock absorbing structure including protrusions and an elastic member. The display panel may have a folding area. The protrusions may be disposed on the display panel. The elastic member may be disposed on the protrusions such that a part of an upper portion of each of the protrusions may be impregnated within the elastic member.

In embodiments, each of the protrusions may have a half-sphere shape.

In embodiments, the protrusions may be arranged in a pattern on the display panel.

In embodiments, a space may be defined by four adjacent protrusions among the protrusions and a bottom surface of the elastic member.

In embodiments, the space may be filled with air.

In embodiments, the air may be trapped in the space.

In embodiments, the protrusions may be arranged in a lattice shape on the display panel.

In embodiments, two or more adjacent protrusions among the protrusions may be in contact with each other.

In embodiments, the shock absorbing structure may further include a first base material disposed on a bottom surface of each of the protrusions.

In embodiments, the shock absorbing structure may further include a second base material facing the first base material and disposed on a top surface of the elastic member.

In embodiments, the protrusions may include first to $n^{th}$ protrusions (where n is an integer of 1 or more), and $k^{th}$, $(k+1)^{th}$, $j^{th}$, and $(j+1)^{th}$ protrusions (where k is an integer between 1 and n, and j is an integer between 1 and n) among the first to $n^{th}$ protrusions may be adjacent to each other. A first space may be defined by the $k^{th}$, $(k+1)^{th}$, $j^{th}$, and $(j+1)^{th}$ protrusions and a bottom surface of the elastic member, and the first space may be filled with air.

In embodiments, $(k-1)^{th}$, $k^{th}$, $(j-1)^{th}$ and $j^{th}$ and protrusions among the first to $n^{th}$ protrusions may be adjacent to each other, and a second space is defined by the $(k-1)^{th}$, $k^{th}$, $(j-1)^{th}$, and $j^{th}$ protrusions and the bottom surface of the elastic member. The second space may be filled with air.

In embodiments, the first and second spaces may be adjacent to each other and connected to each other.

In embodiments, a space may be defined by three adjacent protrusions among the protrusions and a bottom surface of the elastic member.

According to embodiments, a method of manufacturing a display device may be provided as follows. A display panel having a folding area may be provided, and a shock absorbing structure may be formed as follows. A first base material may be provided. Protrusions are formed on a top surface of the first base material. A second base material may be provided. An uncured resin layer may be formed on a bottom surface of the second base material. A top surface of the second base material may be pressed such that a part of an upper portion of each of the protrusions may be impregnated within the uncured resin layer. An elastic member may be formed by curing the uncured resin layer.

In embodiments, the method may further include curing the protrusions after the forming of the protrusions on the top surface of the first base material.

In embodiments, each of the protrusions may have a half-sphere shape, and a space may be defined by four adjacent protrusions among the protrusions and a bottom surface of the elastic member. The space may be filled with air.

In embodiments, each of the protrusions may have a first viscosity, and the uncured resin layer may have a second viscosity which is lower than the first viscosity.

In embodiments, the elastic member may comprise one or more materials selected from the group consisting of silicone, urethane, polyurethane, and thermoplastic polyurethane.

In embodiments, the protrusions may comprise one or more materials selected from a photoresist, a polyacryl-based resin, a polyimide-based resin, a polyamide-based resin, a siloxane-based resin, an acryl-based resin, an epoxy-based resin, and a silicone-based resin. The first and second base materials may comprise one or more materials selected from transparent polyimide, transparent polyethylene naphthalate, transparent polyamide, transparent polyethylene terephthalate, transparent polypropylene, transparent polycarbonate, transparent polystyrene, transparent polysulfone, transparent polyethylene, transparent polyphthalamide, transparent polyethersulfone, transparent polyarylate, transparent polycarbonate oxide, transparent modified polyphenylene oxide, and transparent polyether imide.

In the display device according to the embodiments of the invention, a portion of the top surface of each of the protrusions having a half-sphere shape may be located inside the elastic member, so that the display device may include the shock absorbing structure having a relatively thin thickness. Accordingly, the shock absorbing structure may be prevented from being delaminated from the display panel.

A portion of the top surface of each of the protrusions may be located inside the elastic member, so that the protrusions in the shock absorbing structure may be prevented from being separated from the first base material, and the shock absorbing structure may assist the folding area of the display device so that the folding area of the display device may be easily folded and unfolded.

Furthermore, due to the air filled in the space defined by the four adjacent protrusions among the protrusions and the bottom surface of the elastic member, the protrusions and the elastic member may further reduce an impact. Accordingly, although a thickness of the shock absorbing structure may be relatively reduced, the impact resistance characteristics of the shock absorbing structure may be relatively increased.

BRIEF DESCRIPTION OF THE DRAWINGS

Embodiments of the disclosure can be understood in more detail from the following description taken in conjunction with the accompanying drawings, in which.

DETAILED DESCRIPTION OF THE EMBODIMENTS

Advantages and features of the disclosure and methods for accomplishing the same will be more clearly understood from embodiments described below with reference to the accompanying drawings. However, the disclosure is not limited to the following embodiments but may be implemented in various forms. The embodiments are provided only to complete the disclosure and to fully provide a person having ordinary skill in the art to which the disclosure pertains within the field of the disclosure.

In the drawings, sizes and thicknesses of elements may be enlarged for better understanding, clarity, and ease of description thereof. However, the disclosure is not limited to the illustrated sizes and thicknesses. In the drawings, for better understanding and ease of description, the thicknesses of layers, films, panels, regions, and other elements, may be exaggerated for clarity.

It will be understood that when an element, such as a layer, film, region, substrate, or area is referred to as being "on" another element, it may be directly on or another element or intervening elements may be present therebetween.

Although terms such as "first," "second," and the like may be used herein to describe various components, these components are not limited by these terms. These terms are only used to distinguish one element or component from another element or component. Therefore, a first component described below could be termed a second component without departing from the scope and spirit of the disclosure.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±20%, 10%, or 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, a display device and a method of manufacturing display device according to embodiments of the invention will be described in detail with reference to the accompanying drawings. In the accompanying drawings, same or similar reference numerals refer to the same or similar elements.

Figure 1:
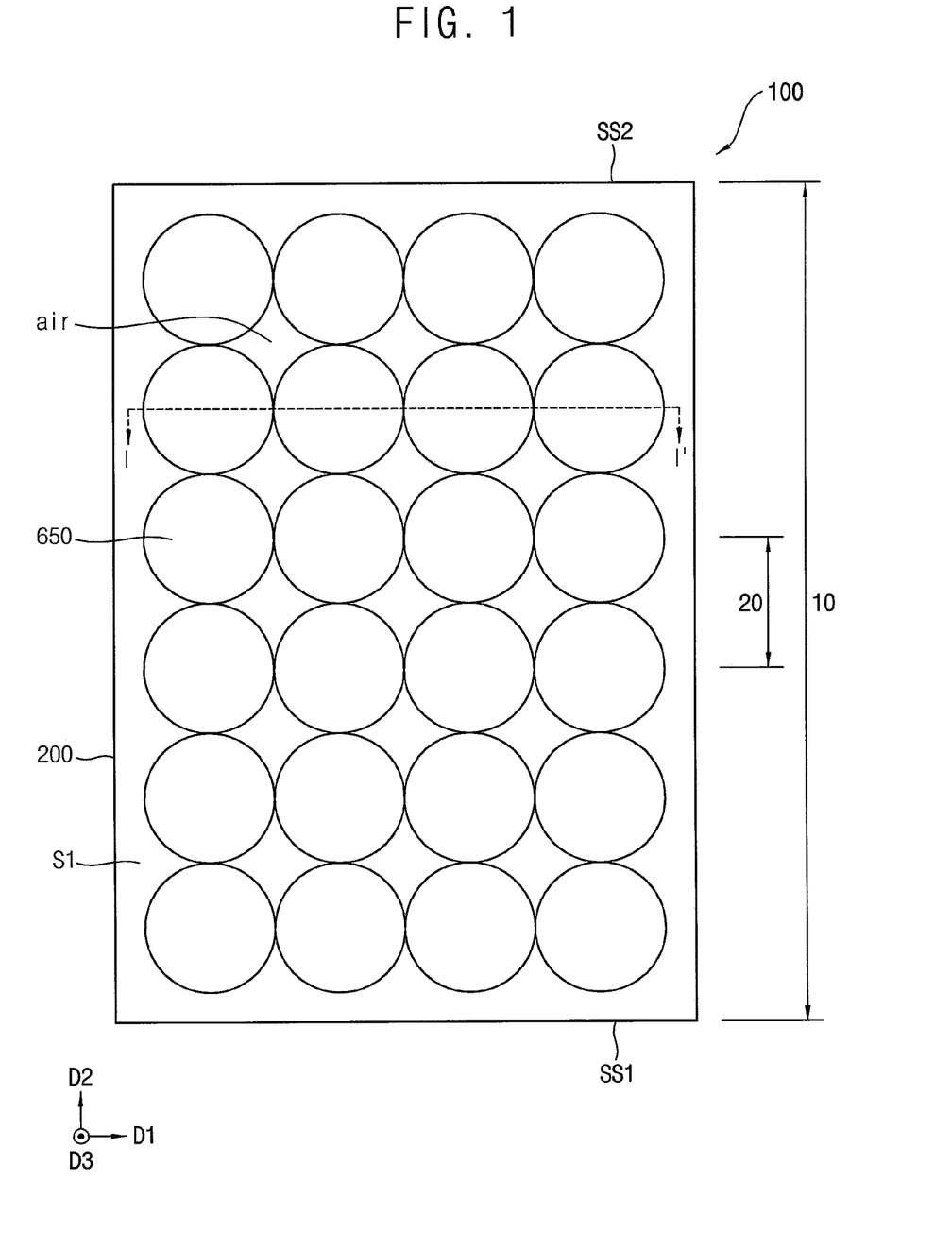
FIG. 1 is a plan view showing a display device according to an embodiment.
Figure 2:
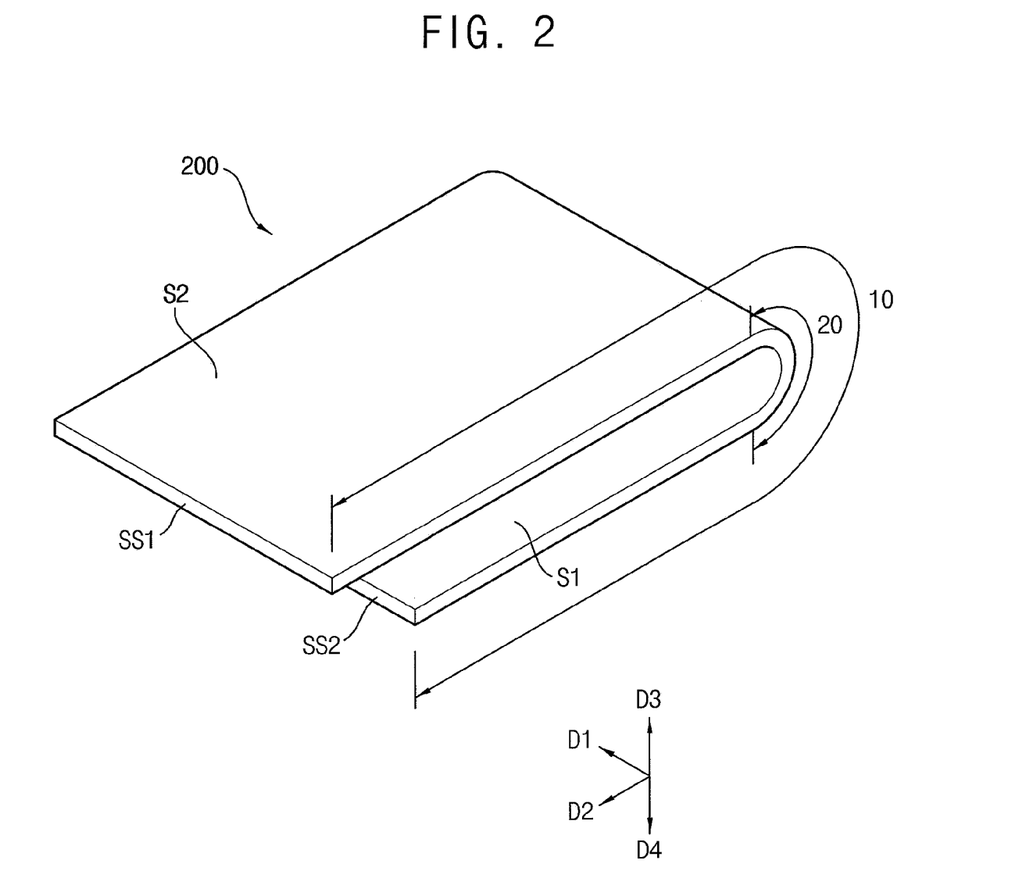
FIG. 2 is a perspective view showing a folded shape of a display panel included in the display device of FIG. 1.
Figure 3:
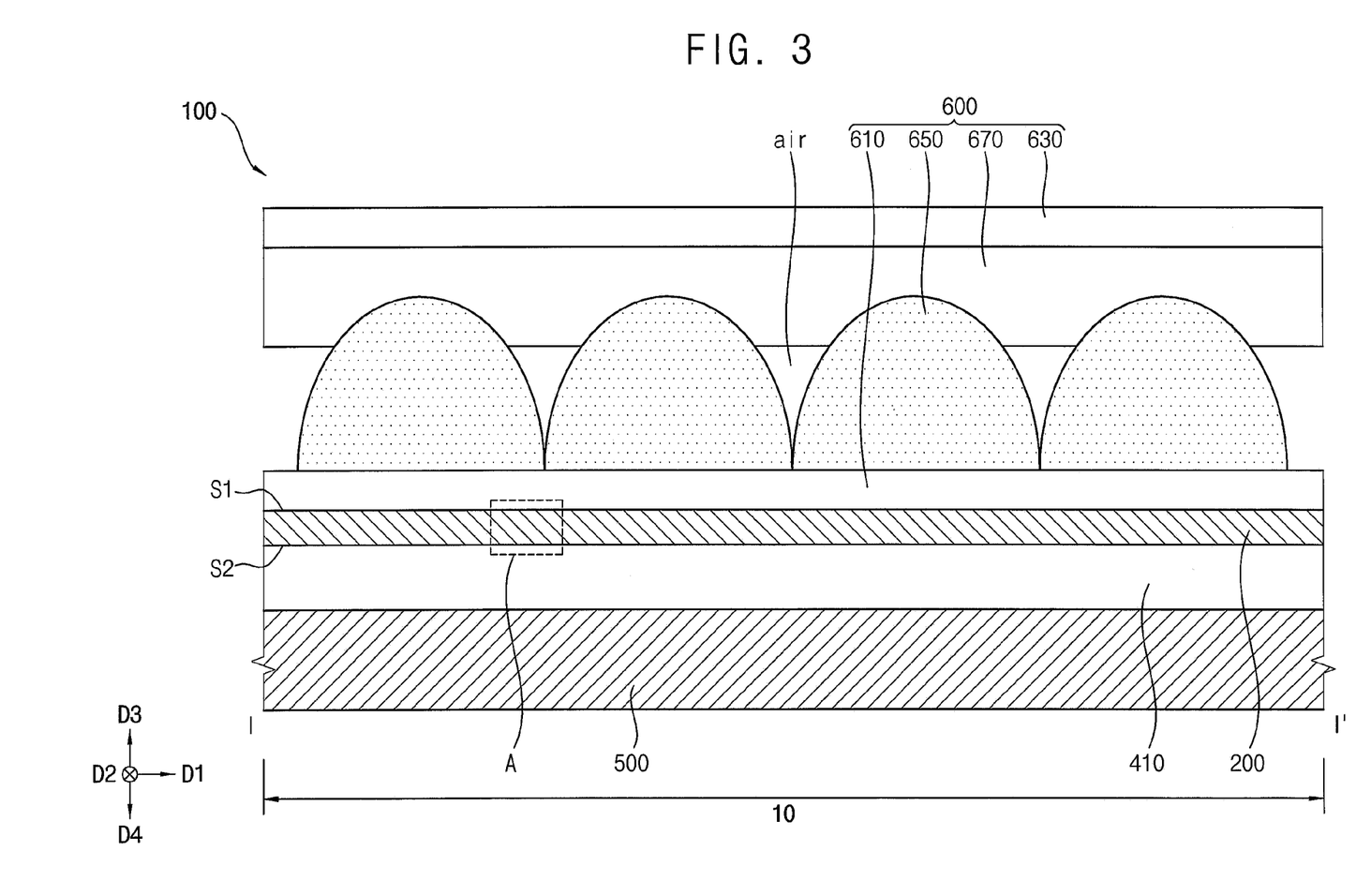
FIG. 3 is a schematic cross-sectional view showing the display device of FIG. 1 taken along line I-I'.

FIG. 1 is a plan view showing a display device according to embodiments of the invention, FIG. 2 is a perspective view showing a folded shape of a display panel included in the display device of FIG. 1, and FIG. 3 is a schematic cross-sectional view showing the display device of FIG. 1 taken along the line I-I'. For example, FIG. 1 shows a state in which a display device 100 is unfolded.

Figure 7:
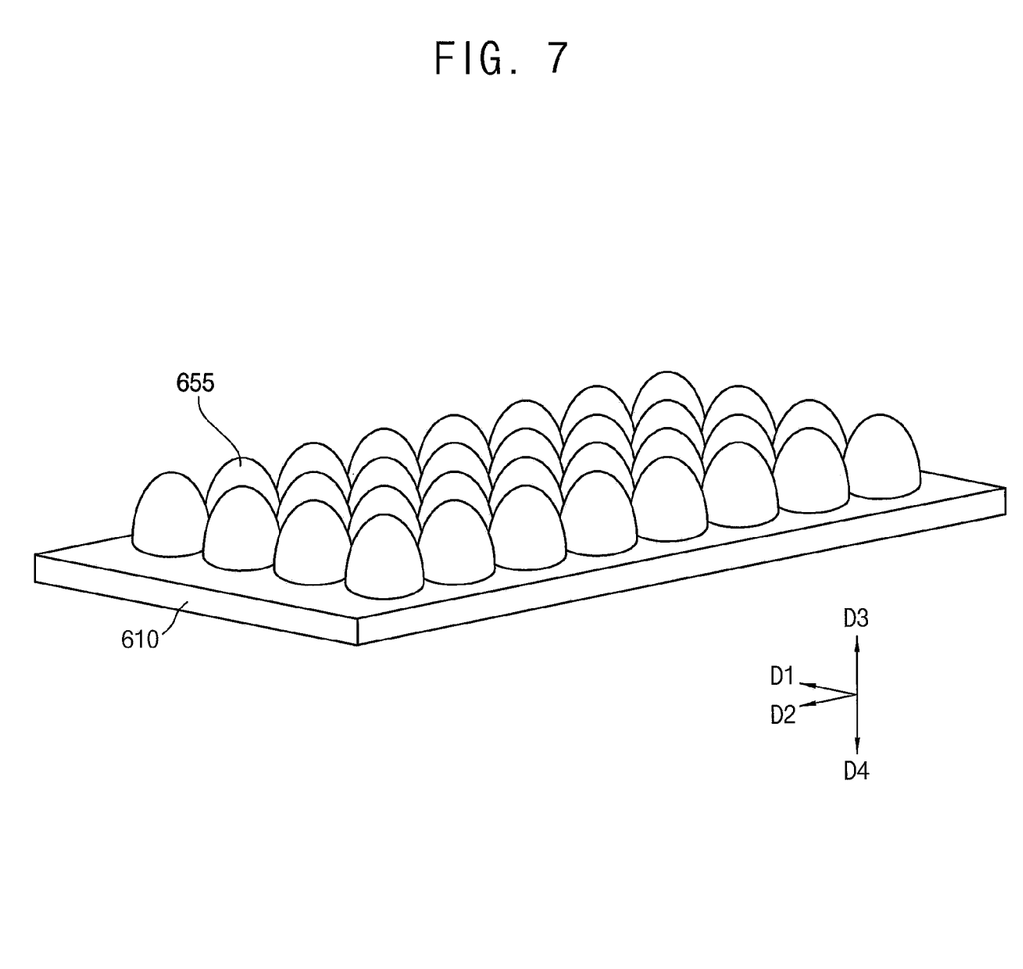
FIGS. 7 to 10 are schematic cross-sectional views showing a method of manufacturing a display device according to embodiments of the invention.

Referring to FIGS. 1, 2 and 3, the display device 100 may include a display panel 200, a shock absorbing structure 600, a support member 500, a lower shock absorbing member 410, and the like. As shown in FIG. 1, the display device 100 may include a display area 10 and a folding area 20. The display area 10 may be an area in which an image is displayed from the display panel 200, and the folding area 20 may be an area in which the display device 100 is folded or unfolded. A portion of the display area 10 may be defined as the folding area 20. As shown in FIG. 3, the shock absorbing structure 600 may include a first base material 610, protrusions 650 which may be arranged in a pattern, an elastic member 670, and a second base material 630. In the embodiments, as shown in FIGS. 1 and 7, the protrusions 650 may be disposed on the display panel 200.

The display panel 200 may be provided. The display panel 200 may include pixels, and an image may be displayed through the pixels. For example, the display panel 200 may have a first surface S1 on which an image is displayed and a second surface S2 facing the first surface S1. The display panel 200 may have a first side surface 551 and a second side surface SS2 facing the first side surface SS1. As shown in FIG. 2, when the display panel 200 located in the folding area 20 is folded, the first side surface SS1 and the second side surface SS2 may be adjacent to each other. The display panel 200 located in the folding area 20 may have a curved shape. The first surface S1 may be located on an inner side, and the second surface S2 may be located on an outer side. In other embodiments, the display panel 200 may be folded such that the first surface S1 is located on the outer side and the second surface S2 is located on the inner side.

Although the display device 100 has been described as including one folding area 20, the invention is not limited thereto. For example, the display device 100 may include at least two folding areas.

The lower shock absorbing member 410 may be disposed on the second surface S2 of the display panel 200. In other words, the lower shock absorbing member 410 may be disposed between the support member 500 and the display panel 200. The lower shock absorbing member 410 may protect the display panel 200 from an impact. For example, the impact may be an external impact. The lower shock absorbing member 410 may include a flexible material so that the display panel 200 may be easily folded. For example, the lower shock absorbing member 410 may include a material in the form of a foam such as a polyurethane foam, and a polystyrene foam. In other embodiments, instead of the lower shock absorbing member 410, an additional shock absorbing structure 600 may be disposed between the display panel 200 and the support member 500.

The support member 500 may be disposed on a bottom surface of the lower shock absorbing member 410. In other words, the support member 500 may be disposed on the second surface S2 of the display panel 200, and may include an opening formed in the folding area 20. The support member 500 may serve to support the display panel 200, and may also serve to assist the display panel 200 so that the display panel 200 may be folded. For example, the support member 500 may be disposed over the second surface S2 of the display panel 200 to support the display panel 200, and may assist the display panel 200 so that the display panel 200 may be folded through the opening formed in the folding area 20.

The support member 500 may include a metal material, a plastic material, or the like having a relatively large elastic force or a relatively large restoring force. In embodiments, the support member 500 may include stainless steel. In some embodiments, the support member 500 may include alloys (e.g., superelastic metals) such as nickel-titanium (Ni—Ti), nickel-aluminum (Ni—Al), copper-zinc-nickel (Cu—Zn—Ni), copper-aluminum-nickel (Cu—Al—Ni), copper-aluminum-manganese (Cu—Al—Mn), titanium-nickel-copper-molybdenum (Ti—Ni—Cu—Mo), cobalt-nickel-gallium: iron (Co—Ni—Ga:Fe), silver-nickel (Ag—Ni), gold-cadmium (Au—Cd), iron-platinum (Fe—Pt), iron-nickel (Fe—Ni), indium-cadmium (In—Cd), or a combination thereof.

The first base material 610 may be disposed on the first surface S1 of the display panel 200. For example, the first base material 610 may be disposed on a bottom surface of each of the protrusions 650. The first base material 610 may be transparent. For example, the first base material 610 may include polyimide (PI), polyethylene naphthalate (PEN), polyamide (PA), polyethylene terephthalate (PET), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), modified polyphenylene oxide (MPPO), polyether imide (PEI), the like, or a combination thereof.

Referring again to FIGS. 1, and 3, the protrusions 650 may be disposed on a top surface of the first base material 610 and the protrusions may be arranged in a pattern. In other words, the protrusions 650 may be repeatedly arranged in a first direction D1 and a second direction D2 on the top surface of the first base material 610, and may protrude in a third direction D3. The first direction D1 may be a direction parallel to the top surface of the first base material 610, the second direction D2 may be perpendicular to the first direction D1, and the third direction D3 may be perpendicular to the first direction D1 and the second direction D2. In other words, the protrusions 650 may be arranged in a lattice shape or pattern on the display panel 200. For example, a height of each of the protrusions 650 may be between about 50 micrometers to about 75 micrometers, and a pitch of the protrusion 650 may be at most about 75 micrometers. A taper angle of a top surface of each of the protrusions 650 may be at most about 45 degrees.

In the embodiments, each of the protrusions 650 may have a half-sphere shape or an emboss shape. A part of an upper portion of each of the protrusions 650 may be impregnated within the elastic member 670. In other words, a part of the upper portion of each of the protrusions 650 may penetrate into the elastic member 670. Two or more adjacent protrusions among the protrusions 650 may make contact with each other.

Each of the protrusions 650 may include a photoresist, a polyacryl-based resin, a polyimide-based resin, a polyamide-based resin, a siloxane-based resin, an acryl-based resin, an epoxy-based resin, a silicone-based resin, the like, or a combination thereof.

The top surface of each of the protrusions 650 may be rounded, a portion of the top surface may penetrate into the elastic member 670, and a material having a relatively low viscosity may be included, so that the protrusions 650 may have a structure which reduces an impact and a structure having elasticity. In other words, the protrusions 650 may protect the display panel 200 from an impact, and the protrusions 650 may assist the folding area 20 of the display device 100 so that the folding area 20 of the display device 100 may be easily folded and unfolded.

In other embodiments, the protrusions 650 may be disposed on a top surface of the display panel 200 without providing the first base material 610. A polarizing film, a sensing structure, and the like may be additionally provided between the protrusions 650 and the display panel 200. The protrusions 650 may be disposed on a top surface of the polarizing film or a top surface of the sensing structure.

Although each of the protrusions 650 has been described as having a half-sphere shape when viewed in a plan view, the shape of each of the protrusions 650 is not limited thereto. For example, each of the protrusions 650 may have a triangular shape, a rectangular shape, a rhombic shape, a polygonal shape, a circular shape, a track shape, or an elliptical shape when viewed in a plan view.

Although the two or more adjacent protrusions among the protrusions 650 have been described as making contact with each other, the invention is not limited thereto. For example, the protrusions 650 may be spaced apart from each other.

Furthermore, although the number of the protrusions 650 has been shown in FIG. 1 as being 24, the invention is not limited thereto. For example, the number of protrusions 650 may be at most about the number of pixels included in the display panel 200.

Referring again to FIGS. 1 and 3, the elastic member 670 may be disposed on the protrusions 650. As described above, at least a portion of the top surface of each of the protrusions 650 may penetrate into a bottom surface of the elastic member 670. In other words, at least a portion of the top surface of each of the protrusions 650 may be located inside the elastic member 670.

For example, when a portion of the top surface of each of the protrusions 650 is not located inside the elastic member 670, the protrusions 650 may be separated from the first base material 610 while the display device 100 is repeatedly folded and unfolded. In embodiments, a portion of the top surface of each of the protrusions 650 may be located inside the elastic member 670, so that while the display device 100 is repeatedly folded and unfolded, the protrusions 650 located in the folding area 20 may be prevented from being excessively spaced apart, and the protrusions 650 may not be separated from the first base material 610.

A space may be defined by four adjacent protrusions among the protrusions 650 and the bottom surface of the elastic member 670. In embodiments, the space may be an empty space. The space may be filled with air, and the air may be trapped in the space. Since the air is present in the space, the protrusions 650 and the elastic member 670 may have a structure which reduces an impact. In other words, the protrusions 650 and the elastic member 670 may protect the display panel 200 from an impact. In the embodiments, the height, the pitch, and the taper angle of the protrusions 650 may be determined such that the space is formed between the elastic member 670 and the protrusions 650.

In other embodiments, in order to protect the protrusions 650 or to trap the air in the space, an edge member interposed between the first base material 610 and the elastic member 670 to surround the protrusions 650 may be additionally provided. The protrusions 650 may be completely surrounded by the first base material 610, the elastic member 670, and the edge member.

While the display device 100 is repeatedly folded and unfolded, the elastic member 670 may be extended and contracted, so that the elastic member 670 may include an elastomer, a thermoplastic elastomer, or a resin which has a relatively large elastic force or a relatively large restoring force. In other words, the elastomer may have a low modulus. For example, the elastomer may include an elastic material such as silicone, urethane, polyurethane, thermoplastic polyurethane (TPU), or a combination thereof. Since the elastic member 670 includes the elastic material, the elastic member 670 may assist the folding area 20 of the display device 100 so that the folding area 20 of the display device 100 may be easily folded and unfolded.

In the embodiments, the protrusions 650 may include first to $n^{th}$ protrusions (where n is an integer of 1 or more). Among the first to $n^{th}$ protrusions, $k^{th}$, $(k+1)^{th}$, $j^{th}$, and $(j+1)^{th}$ protrusions (where k is an integer between 1 and n, and j is an integer between 1 and n) may be adjacent to each other, and a first space may be defined by the $k^{th}$, $(k+1)^{th}$, $j^{th}$, and $(j+1)^{th}$ protrusions and the bottom surface of the elastic member 670. The first space may be filled with air. The $(k-1)^{th}$, $k^{th}$, $(j-1)^{th}$, and $j^{th}$ protrusions among the first to $n^{th}$ protrusions may be adjacent to each other, and a second space may be defined by the $(k-1)^{th}$, $k^{th}$, $(j-1)^{th}$ and $j^{th}$ protrusions and the bottom surface of the elastic member 670. The second space may be filled with air. The first and second spaces may be adjacent to each other and spatially connected to each other, and the air may be trapped in the first and second spaces.

The second base material 630 may be disposed on the elastic member 670. The second base material 630 may face the first base material 610, and may include substantially the same material as the first base material 610. For example, the second base material 630 may be transparent, and may include PI, PEN, PA, PET, PP, PC, PS, PSul, PE, PPA, PES, PAR, PCO, MPPO, PEI, the like, or a combination thereof. In other embodiments, a hard coating layer, a window film, and the like may be additionally provided on the second base material 630 to protect the display device 100.

Accordingly, the shock absorbing structure 600 including the first base material 610, the protrusions 650, the elastic member 670, and the second base material 630 may be provided.

For example, in a conventional foldable display device, a protective film may be disposed on a display panel to protect the display panel. However, the protective film may have a relatively thick thickness in order to ensure impact resistance characteristics. When the display device is folded and unfolded, the protective film may be delaminated from the display panel.

In the display device 100 according to the embodiments of the invention, a portion of the top surface of each of the protrusions 650 having a half-sphere shape is located inside the elastic member 670, so that the display device 100 may include the shock absorbing structure 600 having a relatively thin thickness. Accordingly, the shock absorbing structure 600 may be prevented from being delaminated from the display panel 200.

A portion of the top surface of each of the protrusions 650 may be located inside the elastic member 670, so that the protrusions 650 in the shock absorbing structure 600 may be prevented from being separated from the first base material 610, and the shock absorbing structure 600 may assist the folding area 20 of the display device 100 so that the folding area 20 of the display device 100 may be easily folded and unfolded.

Furthermore, due to the air filled in the space defined by the four adjacent protrusions among the protrusions 650 and the bottom surface of the elastic member 670, the protrusions 650 and the elastic member 670 may further reduce an impact. For example, the impact may be an external impact. Accordingly, although a thickness of the shock absorbing structure 600 is relatively reduced, the impact resistance characteristics of the shock absorbing structure 600 may be relatively increased.

Figure 4:
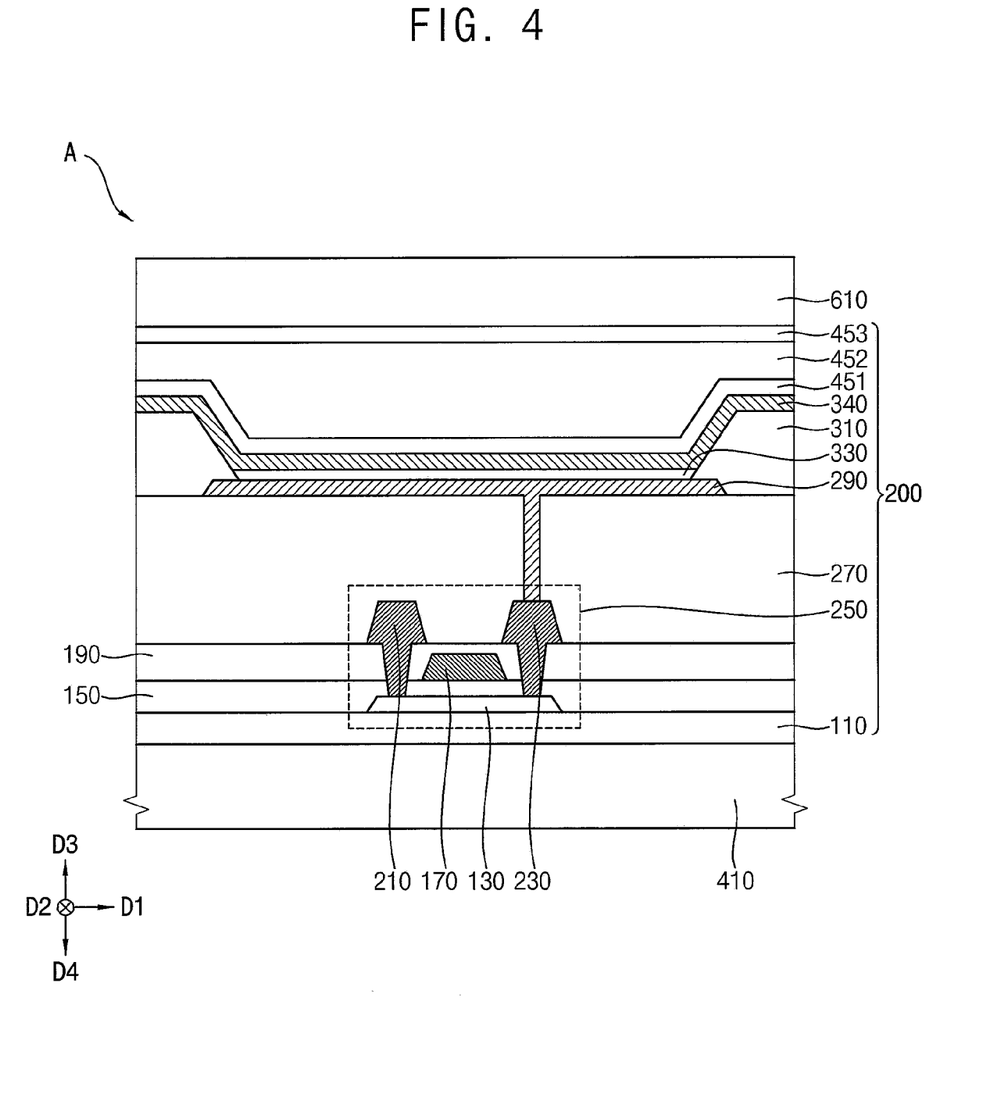
FIG. 4 is an enlarged schematic cross-sectional view showing 'A' region of the display device of FIG. 3.

FIG. 4 is an enlarged schematic cross-sectional view showing 'A' region of the display device of FIG. 3.

The display panel 200 may include a substrate 110, a semiconductor element 250, a planarization layer 270, a lower electrode 290, a pixel defining layer 310, a light emitting layer 330, an upper electrode 340, a first thin film encapsulation layer 451, a second thin film encapsulation layer 452, a third thin film encapsulation layer 453, and the like. The semiconductor element 250 may include an active layer 130, a gate insulating layer 150, a gate electrode 170, an insulating interlayer 190, a source electrode 210, and a drain electrode 230.

The substrate 110 including a transparent or opaque material may be provided. The substrate 110 may be disposed on the shock absorbing member 410. The substrate 110 may be formed of a transparent resin substrate. Examples of the transparent resin substrate that may be used as the substrate 110 include a polyimide substrate. The polyimide substrate may include a first polyimide layer, a barrier film layer, a second polyimide layer, and the like. In other embodiments, the substrate 110 may include a quartz substrate, a synthetic quartz substrate, a calcium fluoride substrate, a fluorine-doped quartz substrate (F-doped quartz substrate), a soda lime glass substrate, a non-alkali glass substrate, the like, or a combination thereof.

A buffer layer may be disposed on the substrate 110. The buffer layer may prevent metal atoms or impurities from diffusing from the substrate 110 to the semiconductor element 250, and may control a heat transfer rate during a crystallization process for forming the active layer to obtain a substantially uniform active layer. When a surface of the substrate 110 is not uniform, the buffer layer may serve to improve flatness of the surface of the substrate 110. Depending on a type of substrate 110, at least two buffer layers may be provided on the substrate 110, or the buffer layer may not be provided. For example, the buffer layer may include an organic material or an inorganic material.

The active layer 130 may be disposed on the substrate 110. The active layer 130 may include a metal oxide semiconductor, an inorganic semiconductor (e.g., amorphous silicon or polysilicon semiconductor), an organic semiconductor, and the like. The active layer 130 may have source and drain regions.

The gate insulating layer 150 may be disposed on the active layer 130. For example, the gate insulating layer 150 may sufficiently cover the active layer 130 on the substrate 110, and may have a substantially flat top surface without creating a step around the active layer 130. In some embodiments, the gate insulating layer 150 may be disposed along a profile of the active layer 130 with a uniform thickness to cover the active layer 130 on the substrate 110. The gate insulating layer 150 may include a silicon compound, metal oxide, etc. For example, the gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), the like, or a combination thereof. In other embodiments, the gate insulating layer 150 may have a multilayer structure including insulating layers. For example, the insulating layers may have mutually different thicknesses or may include mutually different materials.

The gate electrode 170 may be disposed on the gate insulating layer 150. The gate electrode 170 may be disposed at a portion of the gate insulating layer 150 under which the active layer 130 is located. The gate electrode 170 may include a metal, an alloy, metal nitride, conductive metal oxide, a transparent conductive material, etc. For example, the gate electrode 170 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), the like, or a combination thereof. These may be used alone or in combination with each other. In other embodiments, the gate electrode 170 may have a multilayer structure including metal layers. For example, the metal layers may have mutually different thicknesses or may include mutually different materials.

The insulating interlayer 190 may be disposed on the gate electrode 170. The insulating interlayer 190 may sufficiently cover the gate electrode 170 on the gate insulating layer 150, and may have a substantially flat top surface without creating a step around the gate electrode 170. In some embodiments, the insulating interlayer 190 may be disposed along a profile of the gate electrode 170 with a uniform thickness to cover the gate electrode 170 on the gate insulating layer 150. The insulating interlayer 190 may include a silicon compound, metal oxide, etc. In some embodiments, the insulating interlayer 190 may have a multilayer structure including insulating layers. For example, the insulating layers may have mutually different thicknesses or may include mutually different materials.

The source electrode 210 and the drain electrode 230 may be disposed on the insulating interlayer 190. The source electrode 210 may be connected to the source region of the active layer 130 through a contact hole formed by removing first parts of the gate insulating layer 150 and the insulating interlayer 190, and the drain electrode 230 may be connected to the drain region of the active layer 130 through a contact hole formed by removing second parts of the gate insulating layer 150 and the insulating interlayer 190. Each of the source electrode 210 and the drain electrode 230 may include a metal, an alloy, metal nitride, conductive metal oxide, a transparent conductive material, etc. These may be used alone or in combination with each other. In other embodiments, each of the source electrode 210 and the drain electrode 230 may have a multilayer structure including metal layers. For example, the metal layers may have mutually different thicknesses or may include mutually different materials.

Accordingly, the semiconductor element 250 including the active layer 130, the gate insulating layer 150, the gate electrode 170, the insulating interlayer 190, the source electrode 210, and the drain electrode 230 may be provided.

Although the semiconductor element 250 has been described as having a top gate structure, the invention is not limited thereto. For example, the semiconductor element 250 may have a bottom gate structure, a double gate structure, etc.

Although the display device 100 has been described as including one semiconductor element, the invention is not limited thereto. For example, the display device 100 may include at least one semiconductor element and at least one storage capacitor.

The planarization layer 270 may be disposed on the insulating interlayer 190, the source electrode 210, and the drain electrode 230. For example, the planarization layer 270 may have a relatively thick thickness. The planarization layer 270 may have a substantially flat top surface. In order to implement such a flat top surface of the planarization layer 270, a planarization process may be additionally performed on the planarization layer 270. In some embodiments, the planarization layer 270 may be disposed along a profile of the source electrode 210 and the drain electrode 230 with a uniform thickness on the insulating interlayer 190. The planarization layer 270 may be formed of an organic material or an inorganic material. In embodiments, the planarization layer 270 may include an organic material. For example, the planarization layer 270 may include a photoresist, a polyacryl-based resin, a polyimide-based resin, a polyamide-based resin, a siloxane-based resin, an acryl-based resin, an epoxy-based resin, etc.

The lower electrode 290 may be disposed on the planarization layer 270. The lower electrode 290 may be connected to the drain electrode 230 through a contact hole formed by removing a portion of the planarization layer 270, and the lower electrode 290 may be electrically connected to the semiconductor element 250. The lower electrode 290 may include a metal, an alloy, metal nitride, conductive metal oxide, a transparent conductive material, etc. These may be used alone or in combination with each other. In other embodiments, the lower electrode 290 may have a multi-layer structure including metal layers. For example, the metal layers may have mutually different thicknesses or may include mutually different materials.

The pixel defining layer 310 may be disposed on the planarization layer 270. For example, the pixel defining layer 310 may expose a portion of a top surface of the lower electrode 290 while covering both sides of the lower electrode 290. The pixel defining layer 310 may be formed of an organic material or an inorganic material. In the embodiments, the pixel defining layer 310 may include an organic material.

The light emitting layer 330 may be disposed on the lower electrode 290. The light emitting layer 330 may be formed by using at least one of light emitting materials for emitting different color lights (i.e., red light, green light, blue light, etc.) according to pixels. In other embodiments, the light emitting layer 330 may be formed by laminating light emitting materials for emitting different color lights such as red light, green light, and blue light to emit white light as a whole. A color filter may be disposed on the light emitting layer 330 which is disposed on the lower electrode 290. The color filter may include at least one of a red color filter, a green color filter, and a blue color filter. In some embodiments, the color filter may include a yellow color filter, a cyan color filter, and a magenta color filter. The color filter may include a photosensitive resin or a color photoresist.

The upper electrode 340 may be disposed on the light emitting layer 330 and the pixel defining layer 310. The upper electrode 340 may include a metal, an alloy, metal nitride, conductive metal oxide, a transparent conductive material, etc. These may be used alone or in combination with each other. In other embodiments, the upper electrode 340 may have a multilayer structure including metal layers. For example, the metal layers may have mutually different thicknesses or may include mutually different materials.

The first thin film encapsulation layer 451 may be disposed on the upper electrode 340. The first thin film encapsulation layer 451 may be disposed along a profile of the upper electrode 340 with a uniform thickness to cover the upper electrode 340. The first thin film encapsulation layer 451 may prevent the light emitting layer 330 from being deteriorated due to penetration of moisture, oxygen, or the like. The first thin film encapsulation layer 451 may function to protect the display panel 200 from an impact. The first thin film encapsulation layer 451 may include inorganic materials having flexibility.

The second thin film encapsulation layer 452 may be disposed on the first thin film encapsulation layer 451. The second thin film encapsulation layer 452 may improve flatness of the display panel 200 and protect the display panel 200. The second thin film encapsulation layer 452 may include organic materials having flexibility.

The third thin film encapsulation layer 453 may be disposed on the second thin film encapsulation layer 452. The third thin film encapsulation layer 453 may be disposed along a profile of the second thin film encapsulation layer 452 with a uniform thickness to cover the second thin film encapsulation layer 452. The third thin film encapsulation layer 453 may prevent the light emitting layer 330 from being deteriorated due to the penetration of moisture, oxygen, or the like together with the first thin film encapsulation layer 451. The third thin film encapsulation layer 453 may function to protect the display panel 200 from an impact together with the first thin film encapsulation layer 451 and the second thin film encapsulation layer 452. The third thin film encapsulation layer 453 may include inorganic materials having flexibility.

Accordingly, the display panel 200 including the substrate 110, the semiconductor element 250, the planarization layer 270, the lower electrode 290, the pixel defining layer 310, the light emitting layer 330, the upper electrode 340, the first thin film encapsulation layer 451, the second thin film encapsulation layer 452, and the third thin film encapsulation layer 453 may be provided.

Although the display device 100 of the invention has been described as being an organic light emitting diode display device, the invention is not limited thereto. In other embodiments, the display device 100 may include a liquid crystal display device (LCD), a field emission display device (FED), a plasma display device (PDP), or an electrophoretic image display device (EPD).

Figure 5:
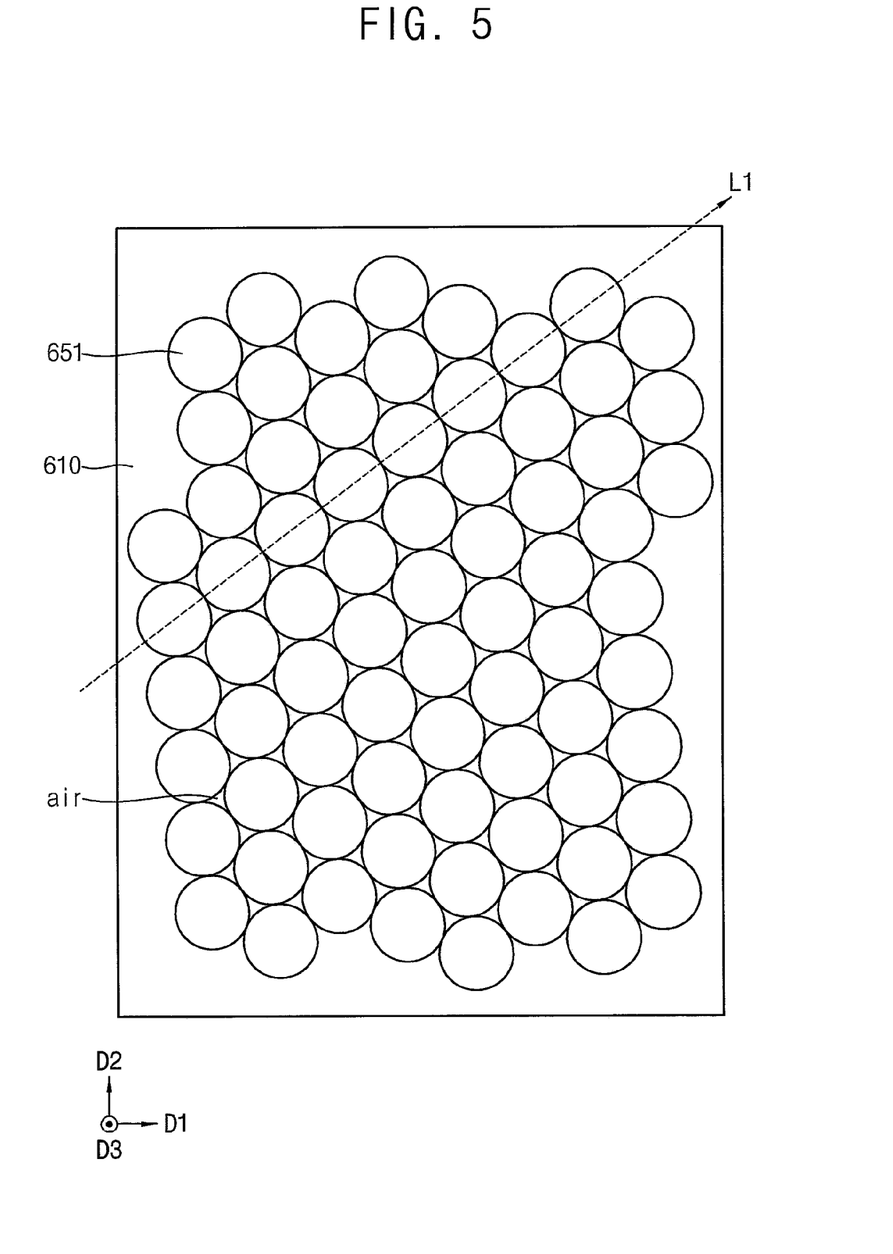
FIG. 5 is a plan view showing one example of protrusions arranged in a pattern included in the display device of FIG. 1.

FIG. 5 is a plan view showing one example of protrusions arranged in a pattern included in the display device of FIG. 1.

Referring to FIGS. 3 and 5, protrusions 651 may be disposed on the top surface of the first base material 610 and they may be arranged in a pattern. In other words, the protrusions 651 may be repeatedly arranged in a diagonal direction L1 on the top surface of the first base material 610, and may protrude in the third direction D3. The diagonal direction L1 may be a direction parallel to the top surface of the first base material 610, and may be a direction different from the first direction D1 and the second direction D2.

In the embodiments, each of the protrusions 651 may have a half-sphere shape or an emboss shape. A part of an upper portion of each of the protrusions 651 may be impregnated within the elastic member 670. In other words, a part of the upper portion of each of the protrusions 651 may penetrate into the elastic member 670. Two or more adjacent protrusions among the protrusions 651 may make contact with each other.

A space may be defined by three adjacent protrusions among the protrusions 651 and the bottom surface of the elastic member 670. In embodiments, the space may be an empty space. The space may be filled with air, and the air may be trapped in the space. Since the air is present in the space, the protrusions 651 and the elastic member 670 may have a structure which reduces an impact. In other words, the protrusions 651 and the elastic member 670 may protect the display panel 200 from an impact. In the embodiments, a height, a pitch, and a taper angle of the protrusions 651 may be determined such that the space is formed between the elastic member 670 and the protrusions 651.

Figure 6:
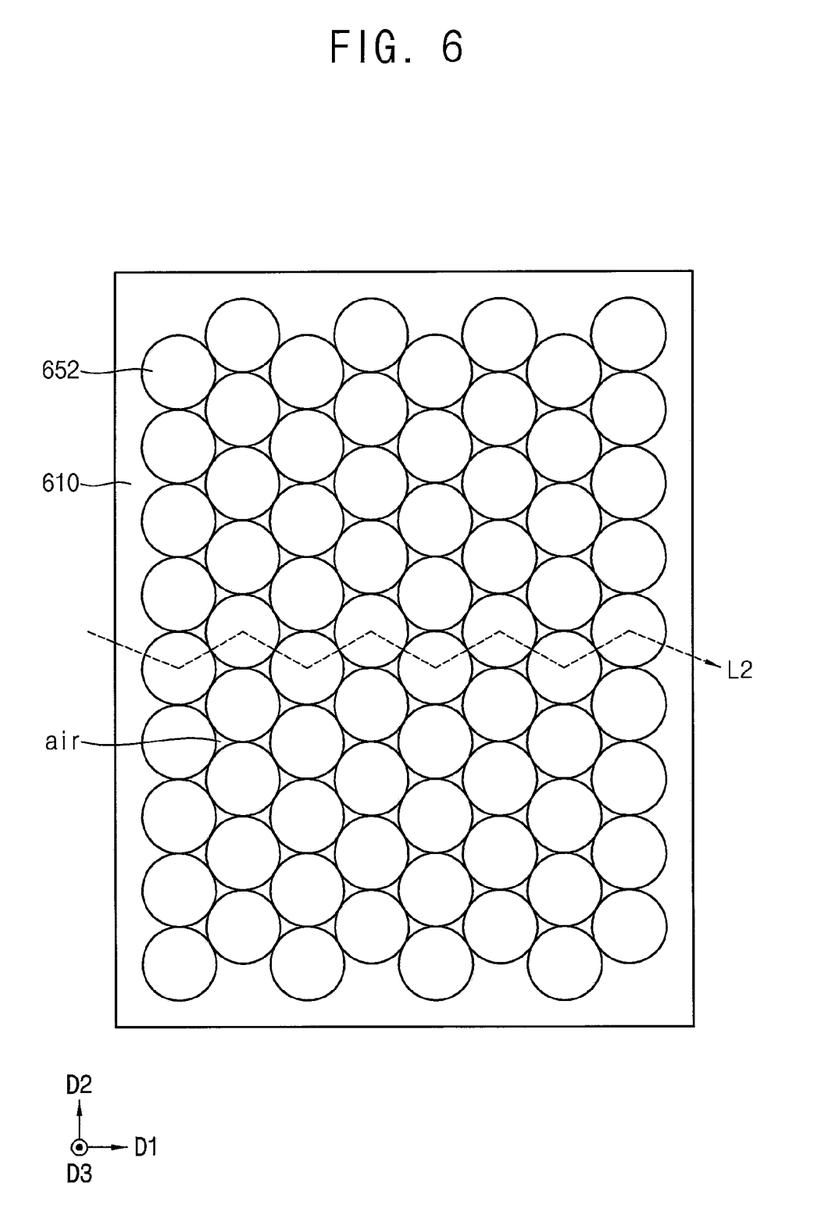
FIG. 6 is a plan view showing another example of protrusions arranged in a pattern included in the display device of FIG. 1.

FIG. 6 is a plan view showing another example of protrusions arranged in a pattern included in the display device of FIG. 1.

Referring to FIGS. 3 and 6, protrusions 652 may be disposed on the top surface of the first base material 610. In other words, the protrusions 652 may be repeatedly arranged in a zigzag direction L2 on the top surface of the first base material 610, and may protrude in the third direction D3. The zigzag direction L2 may be a direction parallel to the top surface of the first base material 610, and may be a direction different from the first direction D1 and the second direction D2.

In the embodiments, each of the protrusions 652 may have a half-sphere shape or an emboss shape. A part of an upper portion of each of the protrusions 652 may be impregnated within the elastic member 670. In other words, a part of the upper portion of each of the protrusions 652 may penetrate into the elastic member 670. Two or more adjacent protrusions among the protrusions 652 may make contact with each other.

A space may be defined by three adjacent protrusions among the protrusions 652 and the bottom surface of the elastic member 670. In embodiments, the space may be an empty space. The space may be filled with air, and the air may be trapped in the space. Since the air is present in the space, the protrusions 652 and the elastic member 670 may have a structure which reduces an impact. In other words, the protrusions 652 and the elastic member 670 may protect the display panel 200 from an impact. In the embodiments, a height, a pitch, and a taper angle of the protrusions 652 may be determined such that the space is formed between the elastic member 670 and the protrusions 652.

FIGS. 7 to 10 are schematic cross-sectional views showing a method of manufacturing a display device according to embodiments of the invention.

Referring to FIG. 7, the first base material 610 may be provided. The first base material 610 may be transparent. For example, the first base material 610 may be formed by using PI, PEN, PA, PET, PP, PC, PS, PSul, PE, PPA, PES, PAR, PCO, MPPO, PEI, and the like.

Protrusions 655 may be formed on the top surface of the first base material 610 and may be arranged in a pattern. In other words, the protrusions 655 may be repeatedly arranged in the first direction D1 and the second direction D2 on the top surface of the first base material 610, and may protrude in the third direction D3. For example, the protrusions 655 may be arranged in a lattice shape on the first base material 610. In the embodiments, each of the protrusions 655 may have a half-sphere shape or an emboss shape. Two or more adjacent protrusions among the protrusions 655 may make contact with each other. Each of the protrusions 655 may be formed by using a photoresist, a polyacryl-based resin, a polyimide-based resin, a polyamide-based resin, a siloxane-based resin, an acryl-based resin, an epoxy-based resin, a silicone-based resin, and the like. In the embodiments, the protrusions 655 may be in an uncured state.

Figure 8:
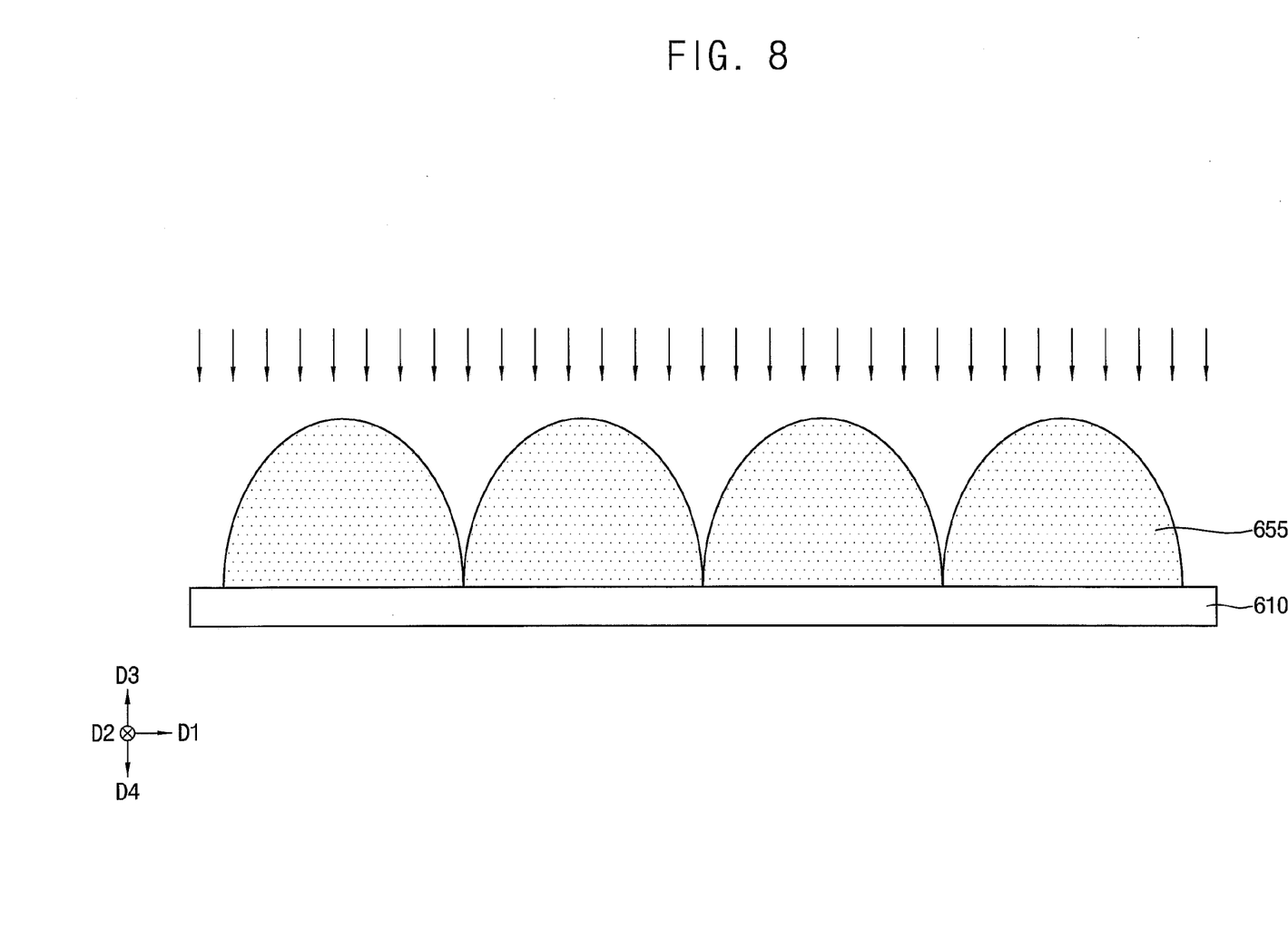

Referring to FIG. 8, the protrusions 655 may be cured. For example, the protrusions 655 may be cured by irradiating the protrusions 655 with ultraviolet (UV) light, laser light, visible light, or the like.

Figure 9:
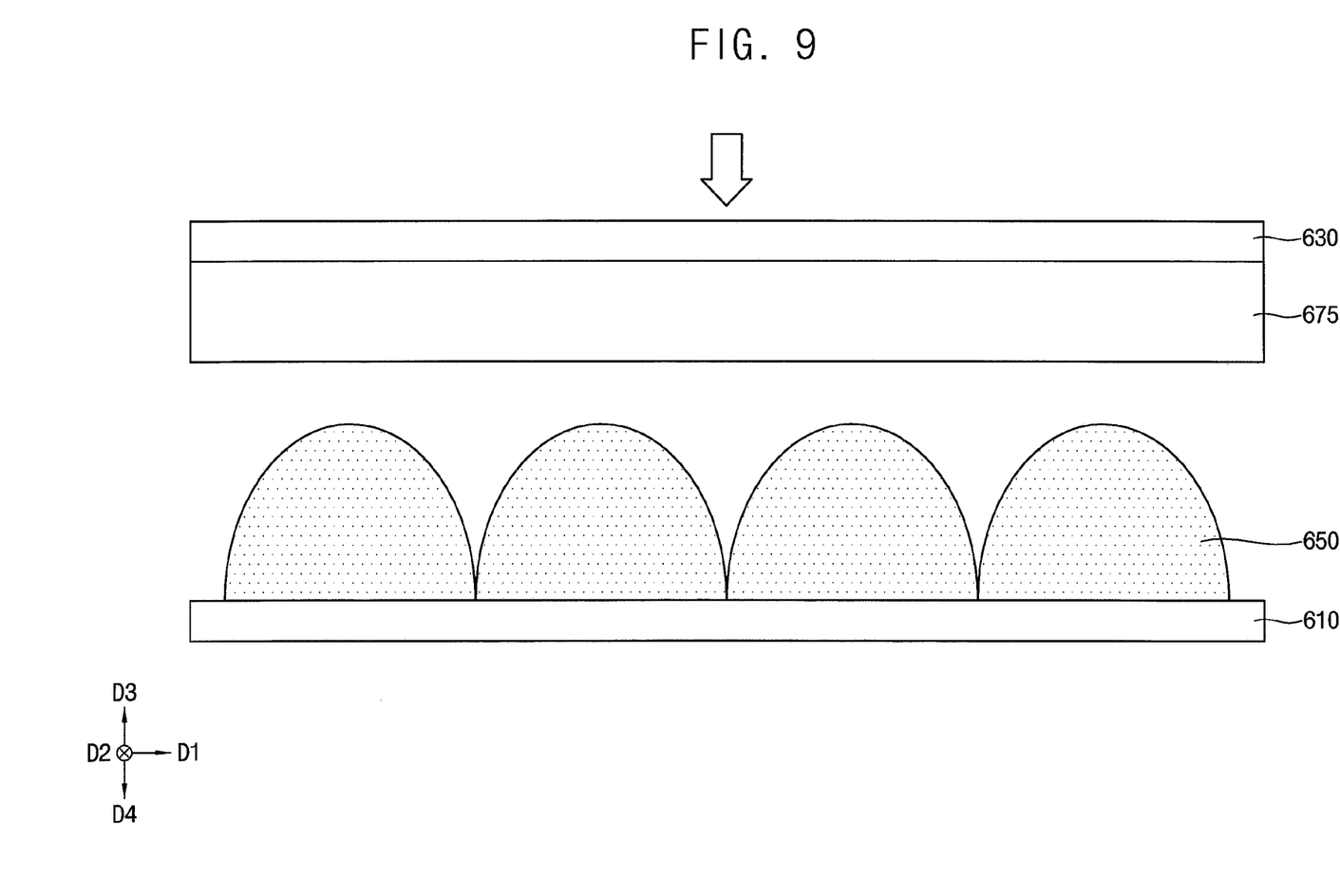

Referring to FIG. 9, the protrusions 650 may be formed on the first base material 610 by curing the protrusions 655. The protrusions 650 may have a first viscosity.

The second base material 630 may be provided. The second base material 630 may be formed by using substantially the same material as the first base material 610. For example, the second base material 630 may be transparent.

An uncured resin layer 675 may be formed on a bottom surface of the second base material 630. In the embodiments, the uncured resin layer 675 may have a second viscosity which is lower than the first viscosity. A top surface of the second base material 630, which may be formed with the uncured resin layer 675, may be pressed in a fourth direction D4. The fourth direction D4 may be a direction opposite to the third direction D3. The uncured resin layer 675 may be formed by using an elastomer, a thermoplastic elastomer, a resin, or the like.

Figure 10:
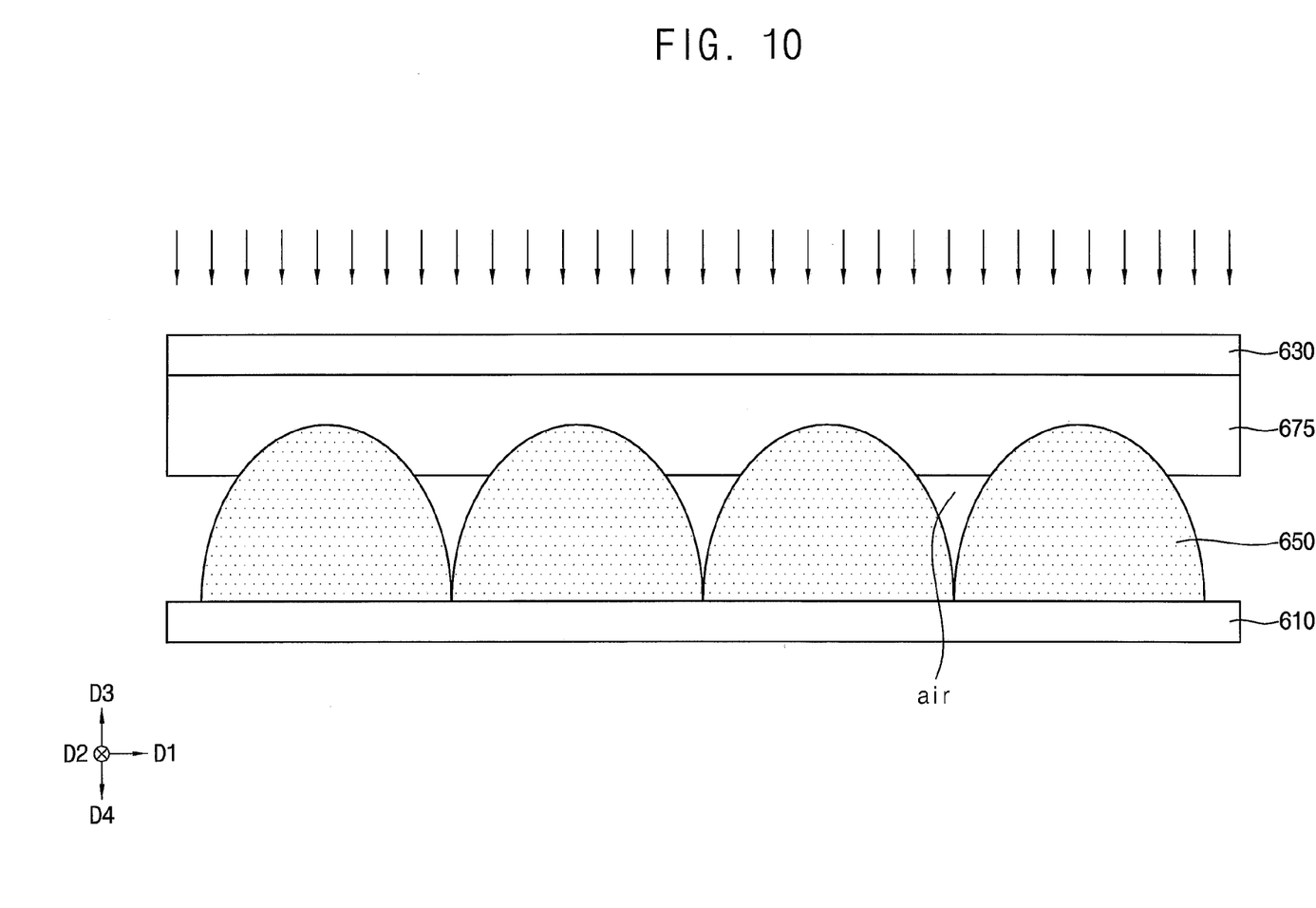

Referring to FIG. 10, a part of the upper portion of each of the protrusions 650 may be impregnated within the uncured resin layer 675. For example, since the uncured resin layer 675 has a relatively low viscosity, a portion of the top surface of each of the protrusions 650 may easily penetrate into the uncured resin layer 675.

After a portion of the top surface of each of the protrusions 650 penetrates into the uncured resin layer 675, the uncured resin layer 675 may be cured. For example, the uncured resin layer 675 may be cured by irradiating the second base material 630 with UV light, laser light, visible light, or the like.

Referring to FIG. 3, the elastic member 670 may be formed by curing the uncured resin layer 675. A viscosity of the elastic member 670 may be higher than the viscosity of the uncured resin layer 675.

Accordingly, the shock absorbing structure 600 including the first base material 610, the second base material 630, the protrusions 650, and the elastic member 670 may be formed.

In the embodiments, the space may be defined by the four adjacent protrusions among the protrusions 650 and the bottom surface of the elastic member 670. In embodiments, the space may be an empty space. The space may be filled with air, and the air may be trapped in the space. Since the air is present in the space, the protrusions 650 and the elastic member 670 may have a structure which reduces an impact. In a process of forming the protrusions 650, the height, the pitch, and the taper angle of the protrusions 650 may be determined such that the space is formed between the elastic member 670 and the protrusions 650.

The display panel 200 may be provided. The display panel 200 may include pixels, and an image may be displayed through the pixels. For example, the display panel 200 may have the first surface S1 on which an image is displayed and the second surface S2 facing the first surface S1. The display panel 200 may have the first side surface SS1 and the second side surface SS2 facing the first side surface 551.

The lower shock absorbing member 410 may be formed on the second surface S2 of the display panel 200. The lower shock absorbing member 410 may protect the display panel 200 from an impact. The lower shock absorbing member 410 may include a flexible material so that the display panel 200 may be easily folded. For example, the lower shock absorbing member 410 may formed by using a material in the form of a foam such as a polyurethane foam, and a polystyrene foam.

The support member 500 may be formed on the bottom surface of the lower shock absorbing member 410. The support member 500 may serve to support the display panel 200, and may also serve to assist the display panel 200 so that the display panel 200 may be folded. For example, the support member 500 may be formed over the second surface S2 of the display panel 200 to support the display panel 200, and may assist the display panel 200 so that the display panel 200 may be folded through the opening formed in the folding area 20.

The support member 500 may be formed by using a metal, plastic, or the like having a relatively large elastic force or a relatively large restoring force. In the embodiments, the support member 500 may include stainless steel. In some embodiments, the support member 500 may include alloys such as Ni—Ti, Ni—Al, Cu—Zn—Ni, Cu—Al—Ni, Cu—Al—Mn, Ti—Ni—Cu—Mo, Co—Ni—Ga:Fe, Ag—Ni, Au—Cd, Fe—Pt, Fe—Ni, In—Cd, or a combination thereof.

As the shock absorbing structure 600 is formed on the first surface S1 of the display panel 200, the display device 100 including the shock absorbing structure 600, the display panel 200, the lower shock absorbing member 410, and the supporting member 500 as shown in FIG. 3 may be manufactured.

The invention may be applied to various electronic devices including a display device. For example, the invention may be applied to vehicle-display device, a ship-display device, an aircraft-display device, portable communication devices, display devices for display or for information transfer, a medical-display device, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed and other embodiments, are intended to be included within the scope of the claims.

What is claimed is:

1. A display device, comprising:
   a display panel that that includes a display area where an image is displayed and having a folding area where the display device is folded, the folding area being within the display area, the display panel having a front major surface on which the image is displayed and a rear major surface opposite the front major surface; and
   a shock absorbing structure arranged on the front major surface of the display panel at locations corresponding to the display area and the folding area, the shock absorbing structure including:
   protrusions disposed on the display panel;
   an elastic member disposed on the protrusions such that a part of an upper portion of each of the protrusions is disposed within the elastic member; and
   a space between the elastic member and the protrusions to protect the display panel from impact, the space being filled with air, the air being trapped within the space.

2. The display device of claim 1, wherein each of the protrusions has a half-sphere shape and includes a photoresist.

3. The display device of claim 1, wherein the protrusions are arranged in a pattern on the display panel and are arranged throughout the display area and the folding area, the protrusions being disposed within the elastic member to prevent the protrusions from being excessively spaced-apart upon the display device being repeatedly folded and unfolded.

4. The display device of claim 1, wherein the protrusions are arranged in a lattice shape on the display panel.

5. The display device of claim 1, wherein two or more adjacent protrusions among the protrusions are in contact with each other.

6. The display device of claim 1, wherein a space is defined by three adjacent protrusions among the protrusions and a bottom surface of the elastic member.

7. The display device of claim 1, wherein:
   the protrusions include a material selected from a group consisting of a photoresist, a polyacryl-based resin, a polyimide-based resin, a polyamide-based resin, a siloxane-based resin, an acryl-based resin, an epoxy-based resin, and a silicone-based resin; and
   the elastic member includes a material selected from a group consisting of silicone, urethane, polyurethane, and thermoplastic polyurethane.

8. The display device of claim 1, wherein the shock absorbing structure further includes a first base material disposed on a bottom surface of each of the protrusions.

9. The display device of claim 8, wherein the shock absorbing structure further includes a second base material facing the first base material and disposed on a top surface of the elastic member.

10. The display device of claim 1, wherein:
    the protrusions include first to $n^{th}$ protrusions (where n is an integer of 1 or more),
    $k^{th}$, $(k+1)^{th}$, $j^{th}$, and $(j+1)^{th}$ protrusions (where k is an integer between 1 and n, and j is an integer between 1 and n) among the first to $n^{th}$ protrusions are adjacent to each other,
    a first space is defined by the $k^{th}$, $(k+1)^{th}$, $j^{th}$, and $(j+1)^{th}$ protrusions and a bottom surface of the elastic member, and
    the first space is filled with air.

11. The display device of claim 10, wherein:
    $(k-1)^{th}$, $k^{th}$, $(j-1)^{th}$, and $j^{th}$ protrusions among the first to $n^{th}$ protrusions are adjacent to each other,
    a second space is defined by the $(k-1)^{th}$, $k^{th}$, $(j-1)^{th}$, and $j^{th}$ protrusions and the bottom surface of the elastic member, and
    the second space is filled with air.

12. The display device of claim 11, wherein the first and second spaces are adjacent to each other and connected to each other.

13. A display device comprising:
    a display panel having a folding area; and
    a shock absorbing structure including:
    protrusions disposed on the display panel; and
    an elastic member disposed on the protrusions such that a part of an upper portion of each of the protrusions is disposed within the elastic member, wherein
    a space is defined by four adjacent protrusions among the protrusions and a bottom surface of the elastic member,
    the space is filled with air, and
    the air is trapped in the space.

14. A method of manufacturing a display device, the method comprising:
    providing a display panel having a folding area; and
    forming a shock absorbing structure, including:
    providing a first base material;
    forming protrusions on a top surface of the first base material;
    providing a second base material;
    forming an uncured resin layer on a bottom surface of the second base material;
    pressing a top surface of the second base material such that a part of an upper portion of each of the protrusions is disposed within the uncured resin layer; and
    forming an elastic member by curing the uncured resin layer.

15. The method of claim 14, further comprising curing the protrusions after the forming of the protrusions on the top surface of the first base material.

16. The method of claim 14, wherein:
    each of the protrusions has a half-sphere shape,
    a space is defined by four adjacent protrusions among the protrusions and a bottom surface of the elastic member, and
    the space is filled with air.

17. The method of claim 14, wherein:
    each of the protrusions has a first viscosity, and
    the uncured resin layer has a second viscosity which is lower than the first viscosity.

18. The method of claim 14, wherein the elastic member includes at least one material selected from the group consisting of silicone, urethane, polyurethane, and thermoplastic polyurethane.

19. The method of claim 14, wherein
- the protrusions include at least one material selected from the group consisting of a photoresist, a polyacryl-based resin, a polyimide-based resin, a polyamide-based resin, a siloxane-based resin, an acryl-based resin, an epoxy-based resin, and a silicone-based resin, and
- the first and second base materials independently include at least one material selected from the group consisting of transparent polyimide, transparent polyethylene naphthalate, transparent polyamide, transparent polyethylene terephthalate, transparent polypropylene, transparent polycarbonate, transparent polystyrene, transparent polysulfone, transparent polyethylene, transparent polyphthalamide, transparent polyethersulfone, transparent polyarylate, transparent polycarbonate oxide, transparent modified polyphenylene oxide, and transparent polyether imide.

* * * * *